US012796039B2

(12) United States Patent
Fan et al.

(10) Patent No.: US 12,796,039 B2
(45) Date of Patent: Nov. 10, 2026

(54) SEMICONDUCTOR DEVICE AND FABRICATING METHOD THEREOF, AND SEMICONDUCTOR WAFER

(71) Applicant: Hatchip Co., Ltd, Shenzhen (CN)

(72) Inventors: Yonghui Frank Fan, Shenzhen (CN); Mingwei Xu, Shenzhen (CN); Xiaobing Fan, Shenzhen (CN)

(73) Assignee: Hatchip Co., Ltd, Shenzhen (CN)

( * ) Notice: Subject to any disclaimer, the term of this patent is extended or adjusted under 35 U.S.C. 154(b) by 292 days.

(21) Appl. No.: 18/745,918

(22) Filed: Jun. 17, 2024

(65) Prior Publication Data

US 2025/0031424 A1 Jan. 23, 2025

Related U.S. Application Data

(63) Continuation of application No. PCT/CN2023/128339, filed on Oct. 31, 2023.

(30) Foreign Application Priority Data

Jul. 20, 2023 (CN) ........................ 202310902084.7

(51) Int. Cl.
*H10D 62/83* (2025.01)
*H10D 30/01* (2025.01)
(Continued)

(52) U.S. Cl.
CPC ....... *H10D 62/8303* (2025.01); *H10D 30/015* (2025.01); *H10D 30/47* (2025.01);
(Continued)

(58) Field of Classification Search
CPC ........... H10D 62/8303; H10D 62/8503; H10D 84/85; H10D 30/015; H10D 30/47; H10P 95/94
(Continued)

(56) References Cited

U.S. PATENT DOCUMENTS

2010/0078651 A1* 4/2010 Wort ........................ C01B 32/28 257/77
2010/0090228 A1* 4/2010 LaRoche ............... C04B 35/581 257/E29.081
(Continued)

FOREIGN PATENT DOCUMENTS

CN 115831968 A 3/2023
CN 116130336 A 5/2023
(Continued)

OTHER PUBLICATIONS

Imura, M. et al., "Demonstration of diamond field effect transistors by AlN/diamond heterostructure," Physica Status Solidi (RRL)—Rapid Research Letters, vol. 5, No. 3, Feb. 15, 2011, 3 pages.
ISA State Intellectual Property Office of the People's Republic of China, International Search Report Issued in Application No. PCT/CN2023/128339, Jan. 24, 2024, WIPO, 4 pages.
(Continued)

*Primary Examiner* — Igwe U Anya
(74) *Attorney, Agent, or Firm* — McCoy Russell LLP

(57) ABSTRACT

A semiconductor device has a first region and a second region including a first structural layer, a second structural layer, first electrode structure and second electrode structure. The material of the first structural layer comprises monocrystalline diamond, and a portion of the first structural layer located in the first region is electrically isolated from a portion located in the second region. The second structural layer is disposed on the first structural layer, and located in the first region, and forms a heterojunction structure with the first structural layer; the material of the second structural layer includes a monocrystalline AlN film or a doped monocrystalline AlN film. The first electrode structure comprises a first source electrode, a first gate electrode and a first drain electrode. The second electrode structure comprises a second source electrode, a second gate electrode and a second drain electrode.

20 Claims, 7 Drawing Sheets

(51) Int. Cl.

| | |
|---|---|
| ***H10D 30/47*** | (2025.01) |
| ***H10D 62/85*** | (2025.01) |
| ***H10D 84/85*** | (2025.01) |
| ***H10P 95/00*** | (2026.01) |

(52) U.S. Cl.
CPC ......... *H10D 62/8503* (2025.01); *H10D 84/85* (2025.01); *H10P 95/94* (2026.01)

(58) Field of Classification Search
USPC .......................................................... 257/195
See application file for complete search history.

(56) References Cited

U.S. PATENT DOCUMENTS

| | | | |
|---|---|---|---|
| 2017/0018639 | A1 | 1/2017 | Teo et al. |
| 2020/0350425 | A1 | 11/2020 | Dutta et al. |
| 2021/0376135 | A1 | 12/2021 | Kwan et al. |
| 2022/0223586 | A1 | 7/2022 | Chowdhury et al. |

FOREIGN PATENT DOCUMENTS

| | | | |
|---|---|---|---|
| CN | 116884976 | A | 10/2023 |
| GB | 2504613 | A | 2/2014 |
| JP | 2008186936 | A | 8/2008 |

OTHER PUBLICATIONS

ISA State Intellectual Property Office of the People's Republic of China, Written Opinion of the International Searching Authority Issued in Application No. PCT/CN2023/128339, Jan. 24, 2024, WIPO, 6 pages. (Submitted with Machine/Partial Translation).

State Intellectual Property Office of the People's Republic of China, Office Action and Search Report Issued in Application No. 202310902084.7, Jan. 26, 2024, 16 pages. (Submitted with Machine/Partial Translation).

State Intellectual Property Office of the People's Republic of China, Notice of Allowance Issued in Application No. 202310902084.7, Apr. 15, 2024, 6 pages. (Submitted with Machine/Partial Translation).

* cited by examiner

SEMICONDUCTOR DEVICE AND FABRICATING METHOD THEREOF, AND SEMICONDUCTOR WAFER

CROSS REFERENCE TO RELATED APPLICATIONS

The present application is a continuation application of International Application No. PCT/CN2023/128339, filed on Oct. 31, 2023, which claims priority to Chinese Patent Application No. 202310902084.7, filed on Jul. 20, 2023, the disclosures of which are incorporated herein by reference in its entirety for all purposes.

TECHNICAL FIELD

The present application belongs to the field of semiconductor technology, and particularly relates to a semiconductor device and a fabricating method thereof, and a semiconductor wafer.

BACKGROUND

An increasing number of power electronics, sensor signal conditioning, and RF communication devices are required to operate at high temperatures. These devices require integrated circuits, such as mixed-signal circuits with analog circuits, analog-to-digital converters, embedded microcontrollers and on-chip memories. In the related art, complementary metal-oxide-semiconductor (CMOS) technology based on silicon is often used to form CMOS circuits integrated with PMOS and NMOS transistors to realize various logic functions, but such a structure is not reliable for stable and continuous operation at a high temperature (for example, above 125° C.).

SUMMARY

According to a first aspect of embodiments of the present application, a semiconductor device is provided having a first region and a second region, including:

- a first structural layer, wherein material of the first structural layer comprises monocrystalline diamond, and a portion of the first structural layer in the first region is electrically isolated from a portion of the first structural layer in the second region, and the portion of the first structural layer in the second region is subjected to hydrogen-termination treatment;
- a second structural layer disposed on the first structural layer and located in the first region, wherein the second structural layer and the portion of the first structural layer in the first region form a heterojunction structure, and material of the second structural layer is a monocrystalline AlN film or a doped monocrystalline AlN film;
- a first electrode structure, comprising a first source electrode, a first gate electrode, and a first drain electrode, the first electrode structure being disposed in the first region and at least partially on a side of the second structural layer away from the first structural layer;
- a second electrode structure, comprising a second source electrode, a second gate electrode and a second drain electrode, wherein the second electrode structure is disposed on the first structural layer and located in the second region, and is on the same side of the first structural layer as the first electrode structure.

In some embodiments, the first drain electrode is connected to the second source electrode, and the first gate electrode is connected to the second gate electrode.

In some embodiments, the first structural layer serves as a substrate.

Or the semiconductor device comprises a substrate, the substrate being on a surface of the first structural layer away from the second structural layer.

In some embodiments, the first structural layer has a thickness of 100 μm-500 μm if the first structural layer serves as a substrate, and has a thickness of 0.1 μm-10 μm if the semiconductor device comprises other layers in contact with the first structural layer as a substrate; and/or, the second structural layer has a thickness of 2 nm to 30 nm.

In some embodiments, the first structural layer serves as a channel layer of the first region, the second structural layer serves as a barrier layer of the first region, and the semiconductor device comprises:

- a cap layer (Cap Layer) disposed in the first region and on a surface of the second structural layer away from the first structural layer.

In some embodiments, the semiconductor device is not provided with a cap layer, wherein the first source electrode and the first drain electrode are both disposed on a surface of the second structural layer away from the first structural layer; or

- a portion of the first source electrode is located on the surface of the second structural layer away from the first structural layer, another portion of the first source electrode penetrates through the second structural layer and is in contact with a surface of the first structural layer, and a portion of the first drain electrode is located on the surface of the second structural layer away from the first structural layer, and another portion of the first drain electrode penetrates through the second structural layer and is in contact with the surface of the first structural layer; or,
- the semiconductor device is provided with a cap layer, wherein the first source electrode and the first drain electrode are both disposed on a surface of the cap layer away from the first structural layer; or
- a portion of the first source electrode is located on the surface of the cap layer away from the first structural layer, another portion of the first source electrode penetrates through the cap layer and a partial depth of the second structural layer; and a portion of the first drain electrode is located on the surface of the cap layer away from the first structural layer, another portion of the first drain electrode penetrates through the cap layer and a partial depth of the second structural layer; or
- a portion of the first source electrode is located on the surface of the cap layer away from the first structural layer, another portion of the first source electrode penetrates through the cap layer and the second structural layer and is in contact with the surface of the first structural layer; and a portion of the first drain electrode is located on the surface of the cap layer away from the first structural layer, another portion of the first drain electrode penetrates through the cap layer and the second structural layer.

In some embodiments, the semiconductor device is not provided with a cap layer, wherein the first gate electrode is disposed on a surface of the second structural layer away from the first structural layer, or

- a portion of the first gate electrode is located on the surface of the second structural layer away from the first structural layer, another portion of the first gate electrode penetrates through a partial depth of the second structural layer;

the semiconductor device is provided with a cap layer, wherein the first gate electrode penetrates through the cap layer and is in contact with the surface of the second structural layer; or a portion of the first gate electrode is disposed on the surface of the cap layer away from the first structural layer, another portion of the first gate electrode penetrates through the cap layer and a partial depth of the second structural layer.

In some embodiments, if the first gate electrode penetrates through a partial depth of the second structural layer, a distance between a bottom end of the first gate and a bottom surface of the second structural layer is 2 nm-15 nm.

In some embodiments, a portion of the first structural layer not covered by the second structural layer is provided with an isolation strip for electrically isolating the first region from the second region.

In some embodiments, the isolation strip extends into the first structural layer from a surface of the first structural layer in contact with the second structural layer, an extension depth of the isolation strip is 2 nm to 20 nm, and a width of the isolation strip is 0.1 μm to 5 μm; and/or the isolation strip is formed by adopting technologies of etching, oxygen plasma treatment or ion implantation.

In some embodiments, a two-dimensional electron gas is formed at an interface between the first structural layer and the second structural layer in the first region, and a N-type transistor is formed in the first region based on the two-dimensional electron gas; a two-dimensional hole gas is formed at a surface of the first structural layer in the second region, and a P-type transistor is formed in the second region based on the two-dimensional hole gas;

The semiconductor device is a CMOS-like device or an integrated circuit integrating the N-type transistor formed based on the two-dimensional electron gas in the first region and the P-type transistor formed based on the two-dimensional hole gas in the second region.

According to a second aspect of an embodiment of the present application, a semiconductor wafer is provided comprising a plurality of chips arranged in arrays, each chip integrating a plurality of semiconductor devices as described above.

According to a third aspect of the embodiments of the present application, a fabricating method of a semiconductor device is provided, comprising:

forming a first structural layer, wherein material of the first structural layer comprises monocrystalline diamond;

forming a second structural layer, wherein the second structural layer is disposed on the first structural layer and located in a first region, and forms a heterojunction structure with a portion of the first structural layer located in the first region, and material of the second structural layer is a monocrystalline AlN film or a doped monocrystalline AlN film;

performing hydrogen-termination treatment on a portion of the first structural layer located in the second region;

electrically isolating the portion of the first structural layer located in the first region from the portion of the first structural layer located in the second region;

fabricating a first electrode structure and a second electrode structure, wherein the first electrode structure comprises a first source electrode, a first gate electrode and a first drain electrode, and is disposed in the first region and at least partially on a side of the second structural layer away from the first structural layer; the second electrode structure comprises a second source electrode, a second gate electrode and a second drain electrode, and the second electrode structure is disposed on top the first structural layer and located in the second region, and is on the same side of the first structural layer as the first electrode structure.

In some embodiments, after fabricating the first electrode structure and the second electrode structure, the method comprises:

connecting the first drain electrode to the second source electrode, and connecting the first gate electrode to the second gate electrode.

In some embodiments, prior to forming the first structural layer, the method includes providing a substrate;

the forming the first structural layer comprises:

forming the first structural layer on the substrate.

In some embodiments, after providing the substrate, the method comprises:

polishing and cleaning a surface of the substrate;

the forming the first structural layer on the substrate comprises:

forming the first structural layer on the polished and cleaned surface of the substrate.

In some embodiments, after forming the second structural layer, the method comprises:

forming a cap layer on a surface of the second structural layer away from the first structural layer In some embodiments, electrically isolating the portion of the first structural layer located in the first region from the portion of the first structural layer located in the second region comprises:

provided an isolation strip at a portion of the first structural layer not covered by the second structural layer, wherein the isolation strip is used for electrically isolating the first region from the second region.

In some embodiments, the isolation strip extends inward from a surface of the first structural layer in contact with the second structural layer, an extension depth of the isolation strip is 2 nm to 20 nm, and a width of the isolation strip is 0.1 μm to 5 μm; and/or the isolation strip is formed by adopting technologies of etching, oxygen plasma treatment or ion implantation.

In some embodiments, forming the second structural layer 2 comprises:

forming a second structural material layer on the first structural layer 1;

removing a portion of the second structural material layer which is located in the second region to form the second structural layer.

Based on the above technical solutions, in the above semiconductor device, the first structural layer is made using monocrystalline diamond, and the second structural layer located in the first region is made using a monocrystalline AlN film or a doped monocrystalline AlN film, so that a two-dimensional electron gas is formed at the interface between the first structural layer and the second structural layer. A portion of the first structural layer located in the second region is subjected to hydrogen termination treatment to form a two-dimensional hole gas at the surface of a portion of the first structural layer. The diamond material has excellent characteristics such as excellent high temperature resistance and thermal conductivity, large bandgap and high breakdown voltage, high electron mobility and high hole mobility, enabling the semiconductor device to form an integrated circuit integrating a N-type transistor (NMOS)

based on two-dimensional electron gas and a P-type transistor (PMOS) based on two-dimensional hole gas, the integrated circuit made therefrom may have the same functions and applications as silicon-based CMOS integrated circuits, implement the same various logic functions as silicon-based CMOS circuits, and can operate more continuously and stably at high temperatures, even at temperatures above 350° C., and can achieve higher output power, operating frequency and breakdown voltage, as compared to using silicon-based complementary metal oxide semiconductor (CMOS) technology.

DETAILED DESCRIPTION

Figure 1:
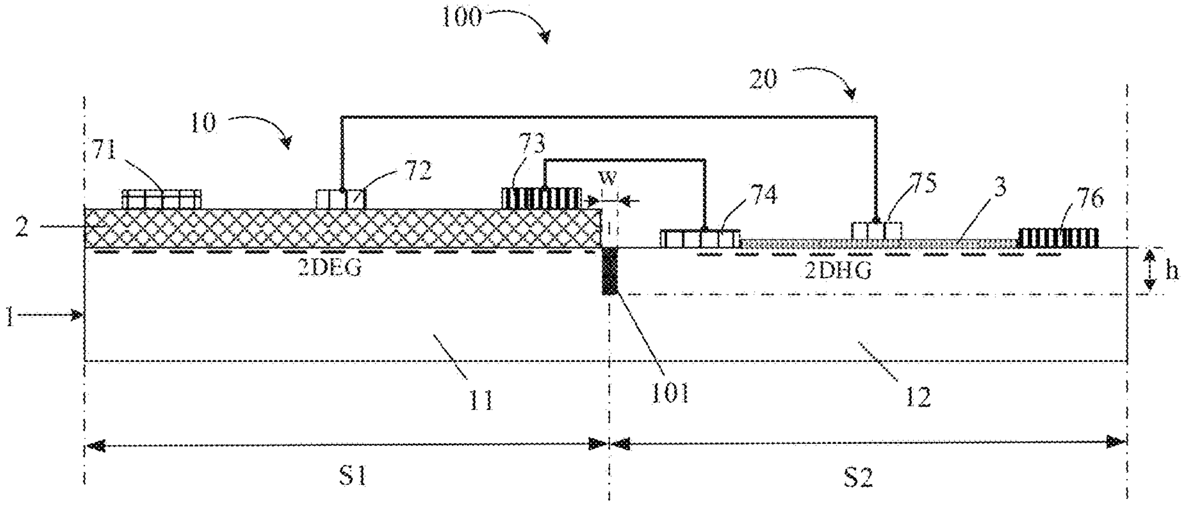
FIG. 1 is a cross-sectional view illustrating a semiconductor device according to an embodiment of the present application.

Exemplary embodiments will be described herein in detail, examples of which are illustrated in the accompanying drawings. Where the following description refers to the drawings, the same numbers in different accompanying drawings indicate the same or similar elements, unless otherwise indicated. The embodiments described in the following exemplary embodiments are not intended to be representative of all embodiments consistent with the present application. The terminology used herein is for the purpose of describing particular embodiments only and is not intended to be limiting of the application.

The present application provides a semiconductor device, a fabricating method thereof and a semiconductor wafer. The semiconductor device has a first region and a second region, and comprises a first structural layer 1, a second structural layer 2, a first electrode structure and a second electrode structure. The material of the first structural layer 1 comprises monocrystalline diamond, two portions of the first structural layer 1 located in the first region and the second region, respectively, are electrically isolated, and the portion of the first structural layer 1 in the second region is subjected to hydrogen-termination treatment. The second structural layer 2 is disposed on the first structural layer 1 and in the first region, and forms a heterojunction structure with the portion of the first structural layer 1 located in the first region; the material of the second structural layer 2 comprises a monocrystalline AlN film or a doped monocrystalline AlN film. The first electrode structure comprises a first source electrode, a first gate electrode and a first drain electrode, and the first electrode structure is disposed in the first region and at least partially on a side of the second structural layer 2 away from the first structural layer 1. The second electrode structure comprises a second source electrode, a second gate electrode, and a second drain electrode. The second electrode structure is disposed on the first structural layer 1 and in the second region, and is on the same side of the first structural layer 1 as the first electrode structure. In the above semiconductor device, the first structural layer 1 adopts a material comprising monocrystalline diamond, and the second structural layer 2 located in the first region adopts a material comprising a monocrystalline AlN film or a doped monocrystalline AlN film, so as to form a two-dimensional electron gas at the interface between the first structural layer 1 and the second structural layer 2. The portion of the first structural layer 1 located in the second region is subjected to hydrogen-termination treatment, forming a two-dimensional hole gas at a portion of the surface of the first structural layer 1. And the diamond material has excellent characteristics such as excellent temperature stability and thermal conductivity, large bandgap and high breakdown voltage, high electron mobility and high hole mobility, enabling the semiconductor device to form an integrated circuit integrating an N-type transistor based on two-dimensional electron gas and a P-type transistor based on two-dimensional hole gas, which can operate more continuously and stably at high temperatures, even at temperatures of up to 350° C. and above, and can achieve higher output power, operating frequency and breakdown voltage, as compared to silicon-based complementary metal oxide semiconductor (CMOS) technology.

The semiconductor device, the manufacturing method thereof, and the semiconductor wafer are described in detail below with reference to FIGS. 1 to 17.

First, the semiconductor device is described with reference to FIGS. 1 to 5.

Figure 5:
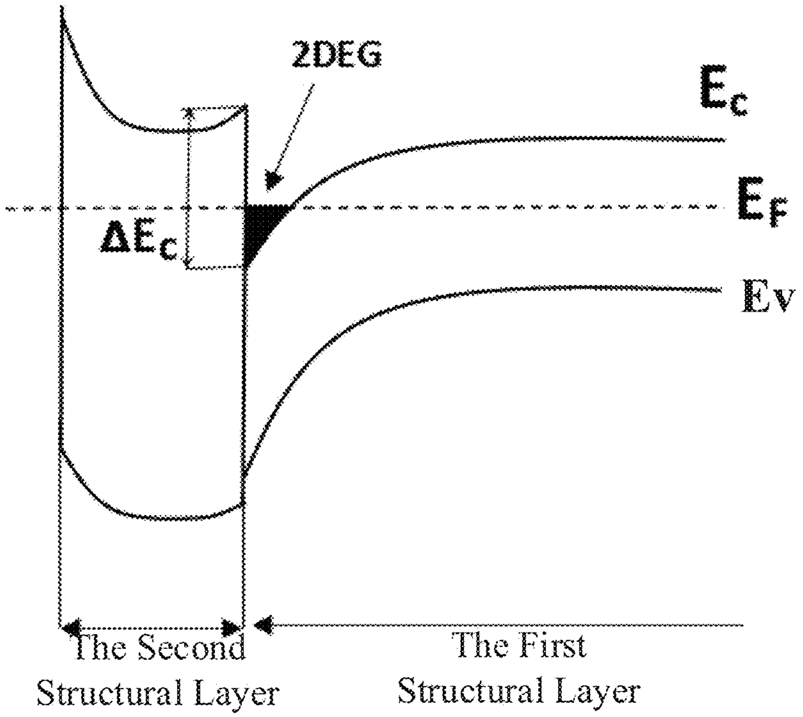
FIG. 5 is a schematic diagram illustrating an energy band of a heterojunction structure according to an embodiment of the present application.

FIG. 1 is a cross-sectional view illustrating a semiconductor device 100 according to an embodiment of the present application. FIG. 5 is a schematic diagram illustrating an energy band of a heterojunction structure according to an embodiment of the present application. Referring to FIG. 1 and, if necessary, in conjunction with FIG. 5, the semiconductor device 100 has a first region S1 and a second region S2. The semiconductor device comprises a first structural layer 1, a second structural layer 2, a first electrode structure and a second electrode structure.

The material of the first structural layer 1 comprises monocrystalline diamond, and a portion of the first structural layer 1 in the first region S1 is electrically isolated from a portion of the first structural layer 1 in the second region S2. The second structural layer 2 is disposed on the first structural layer 1 and located in the first region S1. The second structural layer 2 and the first structural layer 1 in the first region S1 form a heterojunction structure. Wherein the material of the second structural layer 2 includes a monocrystalline AlN film or a doped monocrystalline AlN film. The first electrode structure comprises a first source electrode 71, a first gate electrode 72, and a first drain electrode 73. The first electrode structure is disposed in the first region S1 and at least partially on a side of the second structural layer 2 away from the first structural layer 1.

Diamond has unique physical, chemical, and electrical characteristics, for example, diamond has extremely low chemical reactivity allowing it to be used in highly corrosive environments. The room temperature thermal conductivity of diamond is 10 W/cmK-20 W/cmK, which is the highest among known materials and can reach several times that of materials such as copper and silicon. Diamond is an electrical insulator at room temperature with a resistivity of up to 1016 ohm-cm at room temperature. Furthermore, diamond is also a wide bandgap semiconductor material with a bandgap of about 5.5 eV, and has both high electron mobility (4500 cm2/V·s) and high hole mobility (3800 cm2/V·s).

Diamond may be formed subjected to a high pressure high temperature (HPHT) method. For example, the diamonds formed by this method are often cubic structures, octahedral structures and combination forms of the two. Diamond may also be formed by chemical vapor deposition (CVD), such as plasma enhanced chemical vapor deposition (PECVD) and microwave plasma chemical vapor deposition (MPCVD), etc.

Aluminum nitride (AlN) is a group III-V semiconductor material, which has the largest bandgap and direct bandgap in group III-V compound semiconductors. The bandgap of AlN is about 6.2 eV. It also has excellent piezoelectric properties and other excellent characteristics such as high thermal conductivity, high resistivity, strong breakdown field, small dielectric coefficient and so on.

A material comprising monocrystalline diamond may be used as the first structural layer 1 in the present application. The first structural layer 1 may at the same time serve as a substrate layer, that is, the first structural layer 1 additionally has functions of a substrate layer. As described above, diamond has good physical, chemical and mechanical characteristics, and can be directly used as a substrate layer. In the semiconductor device 100 shown in FIG. 1, the first structural layer 1 is also a substrate layer. And in the first region S1, AlN is grown on the surface of the first structural layer 1 to serve as the second structural layer 2.

In the embodiment, in the first region S1, the first structural layer 1 serves as a channel layer, and the second structural layer 2 serves as a barrier layer.

Due to the excellent properties of the diamond and the AlN material, in the first region S1, the first structural layer 1 formed by the monocrystalline diamond material serves as a channel layer, the second structural layer 2 formed by the monocrystalline AlN film or the doped monocrystalline AlN film material serves as a barrier layer. A heterojunction structure is formed by these two layers and a two-dimensional electron gas (2DEG) is formed at the interface.

In this embodiment, in the first region S1, the first structural layer 1 of diamond can be used as a substrate layer and a channel layer at the same time. The thickness of the first structural layer 1 is 100 μm-500 μm. The second structural layer 2 has a thickness of 2 nm to 30 nm. This is merely an example, and the specific thicknesses of the first structural layer 1 and the second structural layer 2 may be set according to specific situations.

As shown in FIG. 5, the energy band diagram for the AlN/Diamond heterostructure, Ec is the energy level at the bottom of the conduction band, Ev is the energy level at the top of the valance band. ΔEc is the band energy difference formed at the bottom of the conduction band due to different bandgap width between AlN material and diamond material. EF is the Fermi level at an equilibrium state. The diagram shows the wider band gap AlN to the left hand side and the comparatively narrower band gap Diamond on the right. The difference in conduction band energies at the interface of the materials results in a conduction band offset ΔEc and a triangular quantum well is formed. The quantum well confines the electrons in one dimension while they are free to move in the other two dimensions, forming the two-dimensional electron gas (2DEG, as the shaded area in FIG. 5), essentially creating a channel of electrons at the heterojunction. This proposed structure provides a solution to the problem of limited application of AlN and diamond materials in semiconductor devices due to their difficulty in doping.

As shown in FIG. 1, in this embodiment, the first source electrode 71, the first drain electrode 73, and the first gate electrode 72 are all disposed on a surface of the second structural layer 2 away from the first structural layer 1.

The method for fabricating the first source electrode 71 and the first drain electrode 73 may include process steps such as photoresist coating, alignment/exposure, develop, metal deposit, metal lift-off (or etch), photoresist removal, cleaning, and annealing. The source and drain electrodes are typically alloyed from a combination of several metals by high temperature annealing to reduce contact resistance. These metals include Ti, Al, Ni, Pt, Au or others, and may be one metal or a combination of several metals (e.g., 2-6 types of metals), which are typically deposited onto the aluminum nitride epitaxial layer (i.e., the second structural layer 2) layer by layer by a metal evaporation or sputtering process. For example, the source and the drain electrodes can consist of four metal layers, Ti, Al, Ti and Au. The thickness of the four metal layers is in the range of 2 nm-25 nm, 30 nm-300 nm, 20 nm-100 nm and 50 nm-500 nm respectively. For example, Ti 25 nm, Al 50 nm, Ti 100 nm and Au 250 nm can be selected respectively, and the total thickness is 450 nm in this case. Other combinations and thickness of metal layers are also possible. The annealing process is performed in a rapid thermal annealing (RTA) furnace at a temperature generally between 70° and 1000° C., usually around 850° C. The annealing process is performed in an argon or nitrogen atmosphere for 30 seconds to 90 seconds or longer in order to form an ohmic contact to reduce resistance.

The first gate electrode 72 is typically deposited onto the second structural layer 2 layer by layer by metal evaporation or sputtering. The method for fabricating the first gate electrode 72 includes process steps such as photoresist coating, alignment/exposure, develop, metal deposit, metal lift-off (or etch), photoresist removal, and cleaning, which are not described in detail herein. In the structure shown in FIG. 14, the first gate 72 is a Schottky contact, and the metal electrode is directly formed on the surface of the second structural layer 2 (i.e., the barrier layer) to form a Schottky contact with the aluminum nitride layer of the second structural layer 2 (i.e., the barrier layer). The layer of the first gate electrode 72 is generally chosen from a metal with a high work function, such as Pt, Ni, Au, and Ti. Their work functions are 5.65 eV, 5.15 eV, 5.1 cV and 4.33 eV, respectively. The metal layer may consist of one layer of metal or 2-4 layers of metals, for example, Pt/Au or Ni/Au may be selected, with a corresponding thickness range of, e.g. 10 nm-50 nm or 50 nm-250 nm.

It is understood that, in some other embodiments, a portion of the first source electrode is on a surface of the second structural layer away from the first structural layer, another portion of the first source electrode penetrates through the second structural layer and is in contact with a surface of the first structural layer. A portion of the first drain electrode is on a surface of the second structural layer away from the first structural layer. Another portion penetrates through the second structural layer and is in contact with the surface of the first structural layer 1.

In addition, the first gate electrode may also be partially located on the surface of the second structural layer away from the first structural layer 1, and another portion of the first gate electrode penetrates through a portion of the thickness of the second structural layer 2. The first gate electrode penetrates through a partial depth of the second structural layer, and the distance between the bottom end of the first gate electrode and the bottom surface of the second structural layer is 2 nm-15 nm, so as to improve the control capability of the gate electrode on the two-dimensional electron gas in the channel.

It should also be noted that, in some other embodiments, the regions in the second structural layer for disposing the first source electrode and the first drain electrode may also be N-doped to form N-doped regions, so as to further reduce the contact resistance.

In this embodiment, the first structural layer 1 in the second region S2 is subjected to a hydrogen-termination treatment (H-Terminated), that is, the first structural layer 1 in the second region S2 is hydrogen-terminated by using hydrogen-termination technology. The second electrode structure includes a second source electrode 74, a second gate electrode 75, and a second drain electrode 76. The second electrode structure is disposed on the first structural layer 1 in the second region S2, and is located on the same side of the first structural layer 1 as the first electrode structure. The second source electrode 74 and the second drain electrode 76 may be fabricated in a manner similar to the methods for fabricating the first source electrode 71 and the first drain electrode 73 described above. The second gate electrode 75 may be fabricated by a fabricating method similar to that described above for the first gate electrode 72.

Here, hydrogen-termination technology is used to hydrogen terminate the first structural layer 1 (i.e., the diamond material) in the second region S2, so that a P-type channel can be formed on the surface of the material. The technology exploits the principles of electron exchange between materials and the surface acceptor doping with high electron affinity (such as water molecules) to produce high two-dimensional hole concentration and mobility by hydrogen plasma treatment on the surface of diamond. Transistors fabricated by this mechanism are called hydrogen-terminated diamond field effect transistors (H-Terminated Diamond FETs). There are a variety of hydrogen-termination technologies, generally using microwave plasma generated in hydrogen ($H_2$) or deuterium ($D_2$). In the process of hydrogen termination of diamond, the adjustable parameters are pressure, microwave power and time, for example, the pressure range is 50-300 Torr, the microwave power is 1-10 KW, and the time is 1-20 min. The fabrication steps may also be performed in steps, for example, first performed at low voltage and low power conditions, and then performed at high voltage and high power conditions. By optimizing the process parameters, the diamond surface with high two-dimensional hole concentration can be obtained.

After the first structural layer 1 in the second region S2 is subjected to the hydrogen-termination treatment, a two-dimensional hole gas (2DHG) is formed on the surface of the first structural layer 1, which has a relatively high two-dimensional hole gas concentration and mobility.

Continuing referring to FIG. 1, in the second region S2, at least a gate dielectric layer 3 may be disposed on the surface of the first structural layer 1, where the gate dielectric layer locates between the second gate electrode 75 and the first structural layer 1.

The material of the gate dielectric layer 3 may be one or more materials such as $Al_2O_3$, $SiO_2$, $MoO_3$, $WO_3$, $ZrO_2$, AlN, $TiO_x$, $HfO_2$, $LaAlO_3$ and $Ta_2O_5$. The gate dielectric layer 3 may be formed by atomic layer deposition, metal organic chemical vapor deposition, or magnetron sputtering, etc.

These oxides pull electrons out of diamond to form a two-dimensional hole gas (2DHG) in the diamond channel.

Continuing referring to FIG. 1, in some embodiments, the first drain electrode 73 is connected to the second source electrode 74, and the first gate electrode 72 is connected to the second gate electrode 75 to form an integrated circuit including an N-type transistor based on two-dimensional electron gas and a P-type transistor based on two-dimensional hole gas.

Continuing referring to FIG. 1, in some embodiments, the portion of the first structural layer 1 not covered by the second structural layer 2 is provided with an isolation strip 101. The isolation strip 101 is used to electrically isolate the first region S1 from the second region S2.

In some embodiments, the isolation strip 101 extends inward from the surface of the first structural layer 1 (i.e., the surface in contact with the second structural layer 2), and the isolation strip 101 extends a depth "h" of, for example, 2 nm-20 nm. The width "w" of the isolation strip 101 is, for example, 0.1 μm-5 μm.

The isolation strip 101 may be formed by etching, oxygen plasma treatment, ion implantation, etc.

Based on the above description of the semiconductor device 100, an N-type transistor is formed in the first region S1 based on the two-dimensional electron gas, wherein the N-type transistor formed in the first region S1 is similar in concept to an NMOS transistor, and a P-type transistor is formed in the second region S2 based on the two-dimensional hole gas, wherein the P-type transistor formed in the second region S2 is similar in concept to a PMOS transistor. The semiconductor device 100 integrally forms a CMOS-like device or an integrated circuit incorporating the N-type transistor formed based on the two-dimensional electron gas of the first region and the P-type transistor formed based on the two-dimensional hole gas of the second region.

Figure 2:
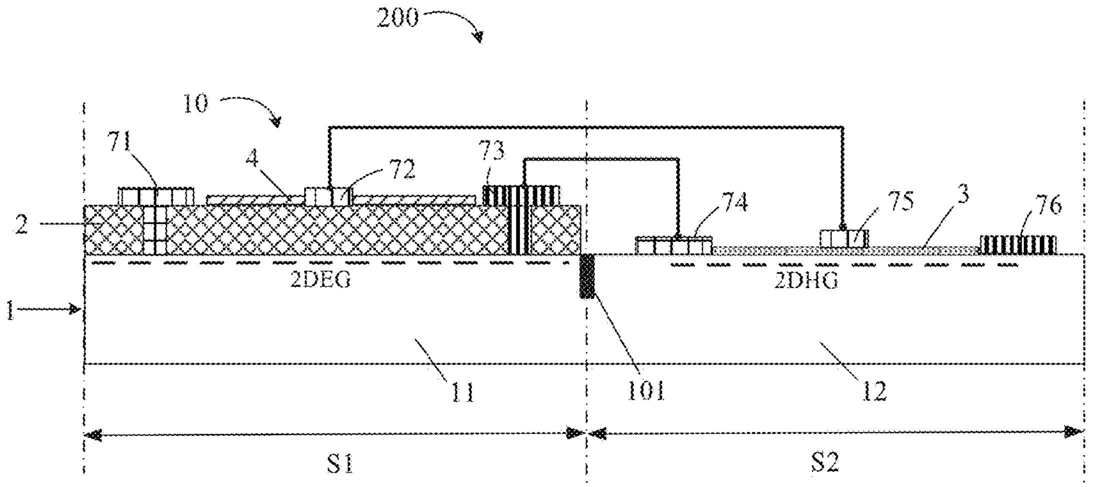
FIG. 2 is a cross-sectional view illustrating another semiconductor device according to an embodiment of the present application.

FIG. 2 is a cross-sectional view illustrating another semiconductor device 200 according to an embodiment of the present application. Referring to FIG. 2, the semiconductor device 200, as compared to the semiconductor device 100 shown in FIG. 1 above, in addition to comprising a first structural layer 1, a second structural layer 2, a first electrode structure, a second electrode structure, etc., further comprises a cap layer 4 located in the first region S1 for protecting the second structural layer 2. The cap layer 4 is disposed on (i.e. grows on) the surface of the second structural layer 2 away from the first structural layer 1.

It can be understood that the cap layer 4 may cover part or all of the surface of the second structural layer 2.

The material of the cap layer 4 may be GaN. Hereinafter, take the material of the cap layer 4 being GaN as an example. Of course, it may also be other materials, such as silicon nitride, or materials such as AlGaN with a low Al composition (AlGaN with an Al composition lower than 0.2), or a combination of GaN and silicon nitride, or a combination of AlGaN and silicon nitride. The cap layer 4 may have a thickness of, for example, 2 nm-20 nm.

In this embodiment, the cap layer 4 covers a portion of the surface of the second structural layer 2 in the first region S1. Specifically, in the areas where the first source electrode 71 and the first drain electrode 73 are arranged, there is no cap layer 4 being provided. A portion of the first source electrode 71 is on a surface of the second structural layer 2 away from the first structural layer 1, and another portion of the first source electrode 71 penetrates through the second structural layer 2 and is in contact with a surface of the first structural layer 1. The first drain electrode 73 is similarly disposed. The first gate penetrates through the cap layer 4 and is in contact with the surface of the second structural layer 2.

Of course, in some other embodiments, there is a cap layer 4 provided in the areas where the first source electrode 71 and the first drain electrode 73 are arranged, a portion of the first source electrode 71 is on a surface of the cap layer away from the first structural layer 1, and another portion of the first source electrode penetrates through the cap layer into the second structural layer 2; a portion of the first drain electrode 73 is on the surface of the cap layer away from the first structural layer 1, and another portion penetrates through the cap layer into the second structural layer 2. Alternatively, in some other embodiments, a portion of the first source electrode 71 is on a surface of the cap layer away from the first structural layer 1, and another portion of the first source electrode 71 penetrates through the cap layer and the second structural layer 2, and is in contact with a surface of the first structural layer 1; a portion of the first drain electrode 73 is on a surface of the cap layer away from the first structural layer 1, and another portion of the first drain electrode 73 penetrates through the cap layer and the second structural layer 2.

Other structures of the semiconductor device 200 may be described with reference to the corresponding description above.

Figure 3:
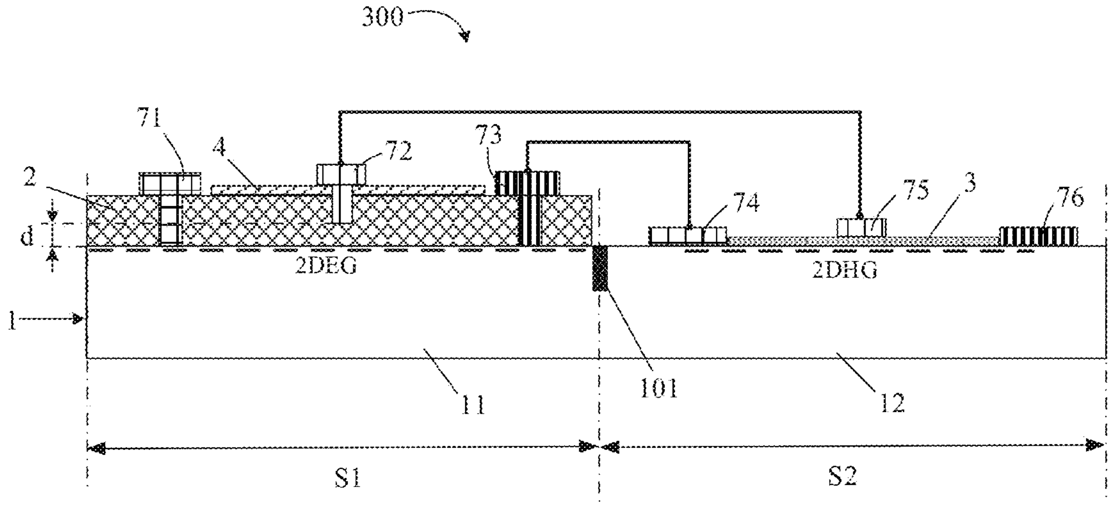
FIG. 3 is a cross-sectional view illustrating yet another semiconductor device according to an embodiment of the present application.

FIG. 3 is a cross-sectional view illustrating another semiconductor device 300 according to an embodiment of the present application. Referring to FIG. 2, the semiconductor device 300 is different from the semiconductor device 200 shown in FIG. 2 in that, in this embodiment, a portion of the first gate electrode 72 is disposed on a surface of the cap layer 4 away from the first structural layer 1, a portion of the first gate electrode 72 penetrates through the cap layer 4, and another portion of the first gate electrode 72 penetrates a portion of the second structural layer 2 in depth.

In this embodiment, the first gate electrode 72 penetrates through part of the depth of the second structural layer 2, so that there is a certain distance between the first gate 72 and the bottom surface of the second structural layer 2. For example, as shown in FIG. 3, the distance between the bottom end of the first gate electrode 72 and the bottom surface of the second structural layer 2 is, for example, 2 nm-15 nm, so as to improve the control capability of the gate electrode over the two-dimensional electron gas while the second structural layer can form enough two-dimensional electron gas.

Figure 4:
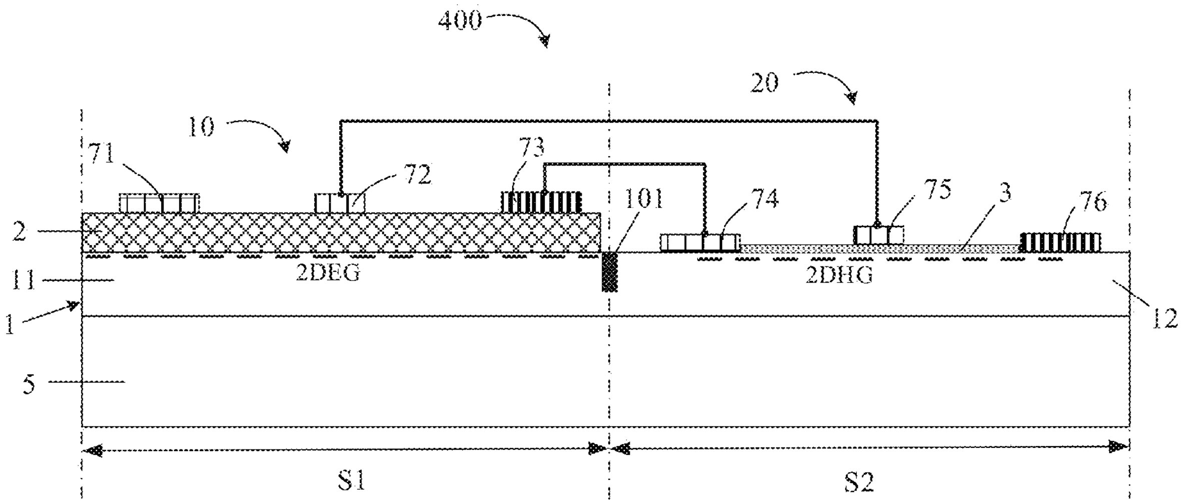
FIG. 4 is a cross-sectional view illustrating a further semiconductor device according to an embodiment of the present application.

FIG. 4 is a cross-sectional view illustrating a further semiconductor device 400 according to an embodiment of the present application. Referring to FIG. 4, as compared to the semiconductor device 100 shown in FIG. 1 above, in addition to comprising a first structural layer 1, a second structural layer 2, etc., the semiconductor device 400 further includes a substrate (i.e., a substrate layer) 5. The substrate 5 is on a surface of the first structural layer 1 away from the second structural layer 2.

The material of the substrate 5 may be silicon (including SOI), silicon carbide, sapphire, etc.

In this embodiment, the thickness of the first structural layer 1 is, for example, 0.1 μm-10 μm.

The thickness of the second structural layer 2 is, for example, 2 nm-30 nm. The specific thicknesses of the first structural layer 1 and the second structural layer 2 may be set according to specific situations.

Figure 6:
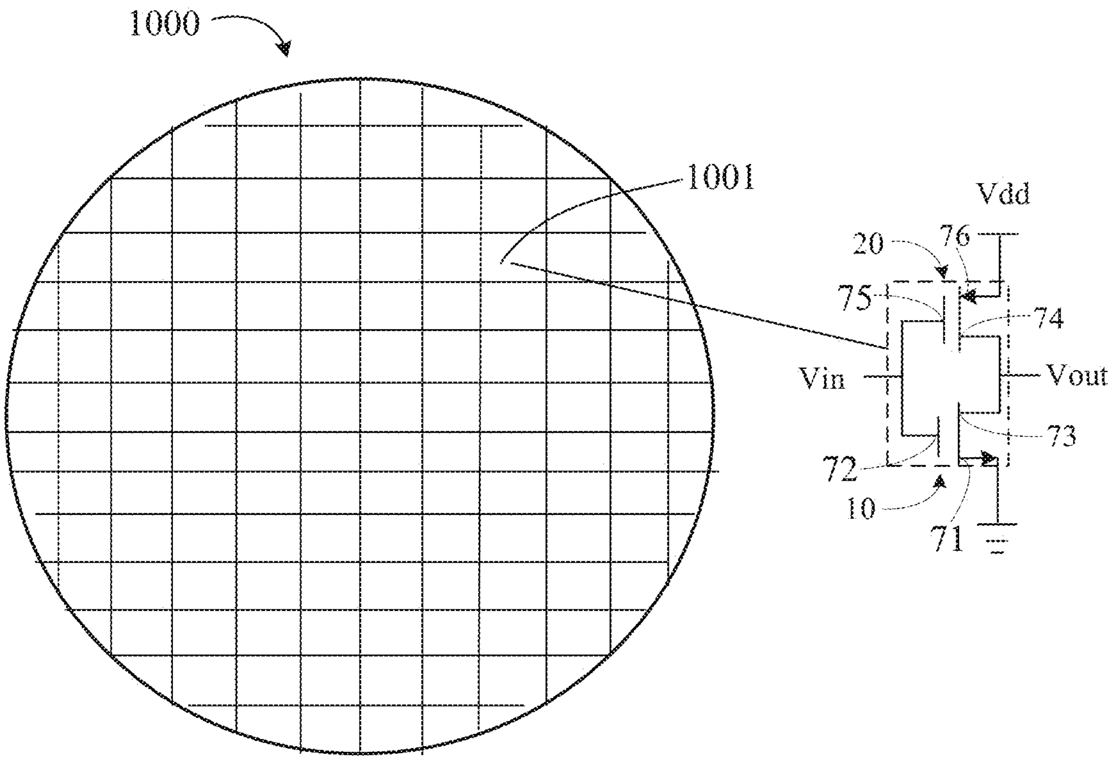
FIG. 6 is a schematic structural diagram illustrating a semiconductor wafer according to an embodiment of the present application.

The present application further provides a semiconductor wafer comprising a plurality of chips arranged in arrays, each chip being integrated with a plurality of the above semiconductor devices. For example, referring to FIG. 6, the semiconductor wafer 1000 shown in FIG. 6 has a plurality of chips 1001 arranged in arrays. A certain number of the aforementioned device units (i.e., the aforementioned semiconductor devices) are integrated on the chip 1001 to form an integrated circuit, i.e., a CMOS-like integrated circuit formed by the aforementioned N-type transistor based on the two-dimensional electron gas and the P-type transistor based on the two-dimensional hole gas, so as to realize various logic functions and meet the requirements of different product performance and application. As shown in FIG. 6, a schematic diagram of a CMOS-like logic circuit unit fabricated on the chip 1001 is also shown in FIG. 6.

Figure 7:
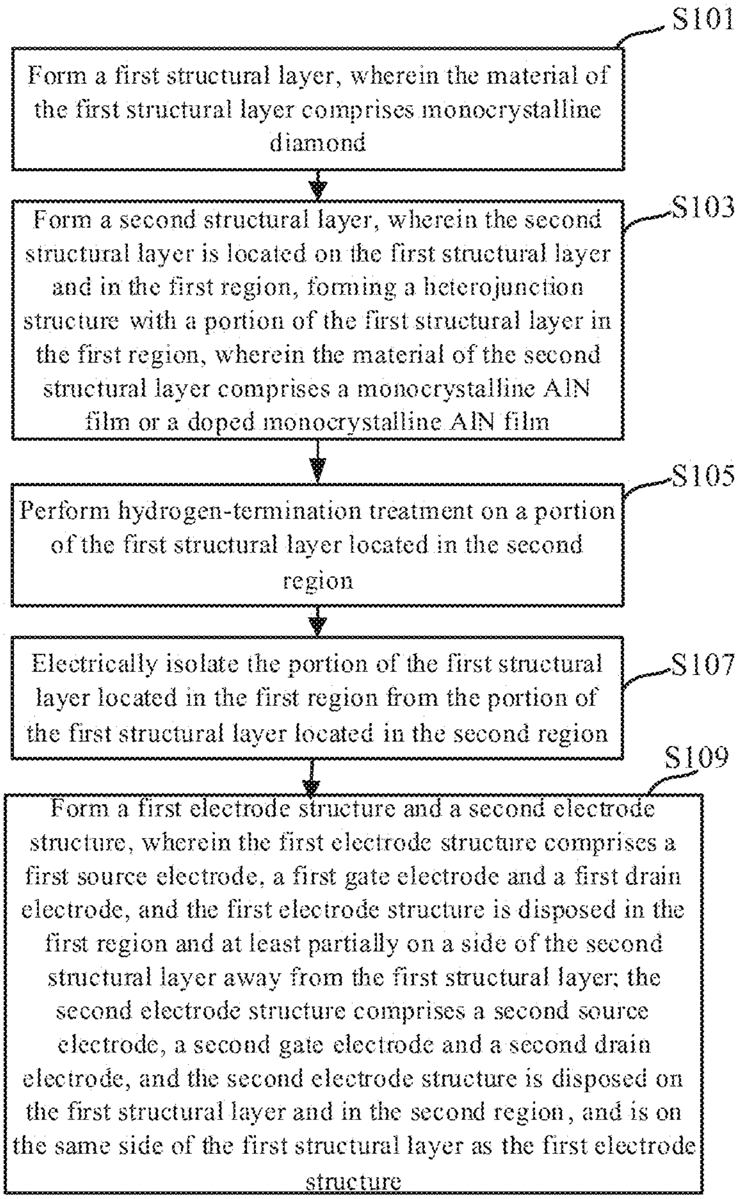
FIG. 7 is a flowchart illustrating a method of fabricating a semiconductor device according to an embodiment of the present application.

Referring to FIG. 7, and in combination with FIG. 1 to FIG. 4 as necessary, the present application further provides a method for fabricating a semiconductor device comprising the following steps S101 to S109.

In step S101, a first structural layer is formed, wherein the material of the first structural layer comprises monocrystalline diamond;

In step S103, a second structural layer is formed on the first structural layer and in the first region, forming a heterojunction structure with the first structural layer in the first region, wherein the material of the second structural layer comprises a monocrystalline AlN film or a doped monocrystalline AlN film;

In step S105, the first structural layer located in the second region is subjected to a hydrogen-termination treatment;

In step S107, a portion of the first structural layer in the first region is electrically isolated from a portion of the first structural layer in the second region;

In step S109, a first electrode structure and a second electrode structure are formed, wherein the first electrode structure comprises a first source electrode, a first gate electrode and a first drain electrode, and the first electrode structure is disposed in the first region and at least partially on a side of the second structural layer away from the first structural layer; the second electrode structure comprises a second source electrode, a second gate electrode and a second drain electrode, and the second electrode structure is disposed on the first structural layer and in the second region, and is on the same side of the first structural layer as the first electrode structure.

First, referring to FIGS. 8 to 17, the fabrication of the semiconductor device 100 is described as an example.

Figure 8:
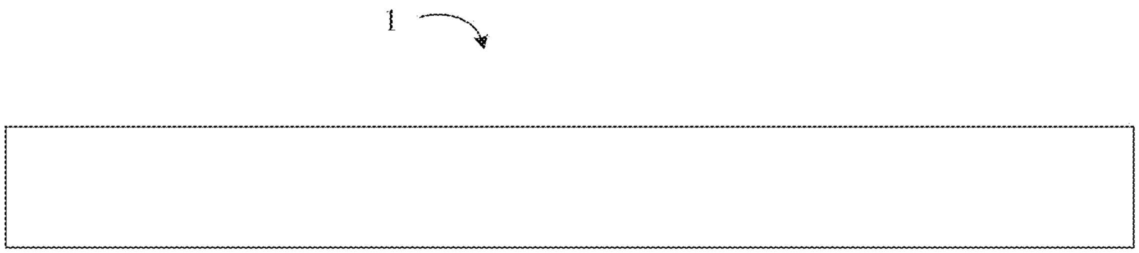
FIGS. 8 to 17 are diagrams illustrating a fabricating process of a semiconductor device according to an embodiment of the present application.

As shown in FIG. 8, in step S101, a first structural layer 1 is formed.

In some embodiments, the first structural layer 1 is formed subjected to a high pressure high temperature (HPHT) method.

In other embodiments, the first structural layer 1 is formed by a chemical vapor deposition (CVD), such as PECVD or MPCVD.

Figure 9:
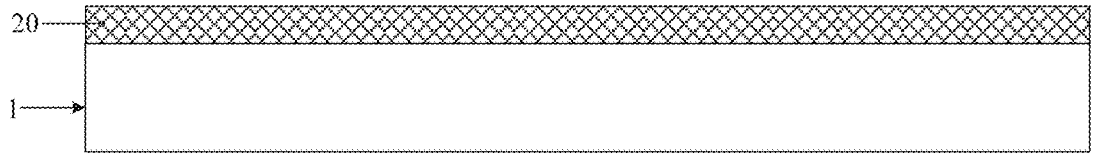
Figure 10:
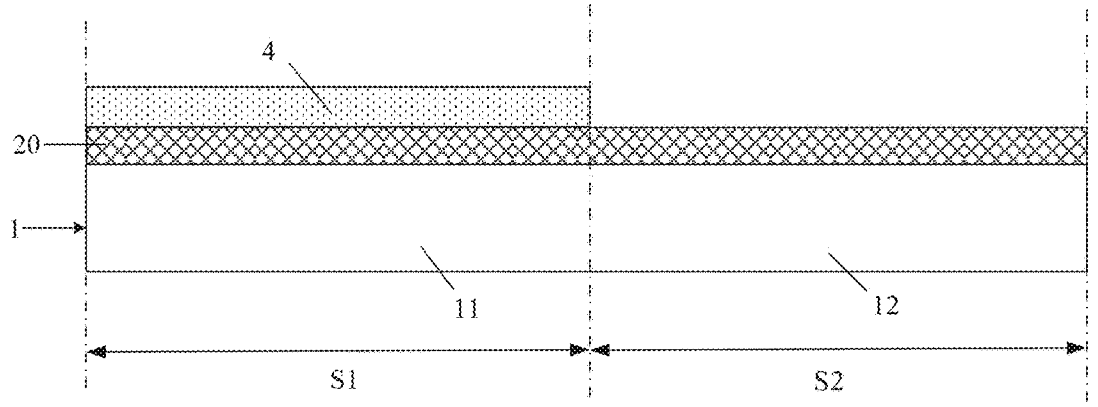
Figure 11:
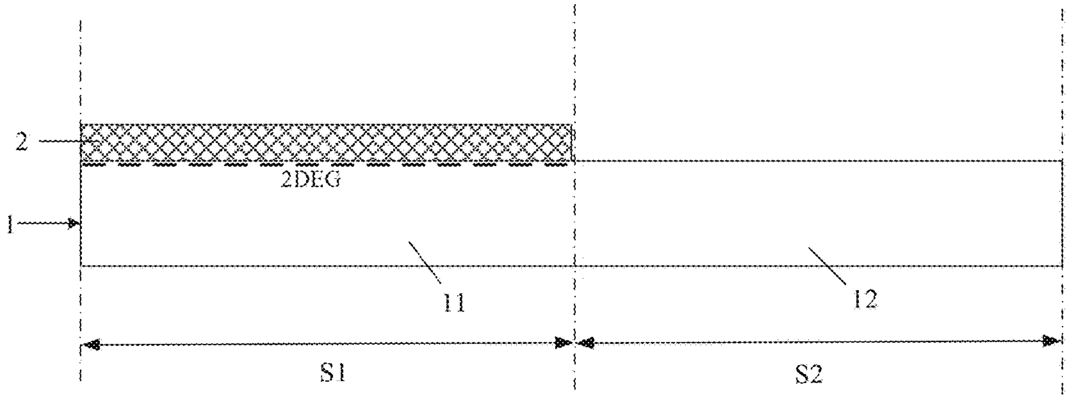

As shown in FIGS. 9 to 11, the step S103 may be implemented by the following steps S1031 and S1032:

As shown in FIG. 9, in step S1031, a second structural material layer 20 is formed on the surface of the first structural layer 1.

The thickness of the second structural material layer 20 ranges, for example, from 2 nm to 30 nm.

The second structural material layer 20 may be fabricated by various methods, and a commonly used method is metal organic chemical vapor deposition (MOCVD). Trimethylaluminum (TMAl, C3H9Al) and ammonia (NH3) are generally used as the aluminum source and nitrogen source respectively, and hydrogen is used as the carrier gas. Monocrystalline aluminum nitride films with high quality may be grown by adjusting the pressure, the temperature and the gas flow of the reaction furnace. In order to reduce the stresses and dislocations caused by the lattice mismatch between the diamond material and the aluminum nitride material, a layer of amorphous film, such as silicon oxide, silicon nitride, silicon oxynitride and other materials, may be grown between the grown AlN films. The growing methods include atomic layer deposition (ALD), chemical vapor deposition (CVD), physical vapor deposition (PVD), etc. The thickness of the amorphous film is 0.5-5 nm. In order to further improve the concentration and mobility of two-dimensional electron gas, AlN can be doped to increase the piezoelectric coefficient of the material and to enhance the piezoelectric polarization effect. The fabricating method is to add an metalorganic gas source containing the element Sc, Tris (cyclopentadienyl) scandium (III) (the chemical formula is C15H15Sc) in the process of growing AlN. Thus, while the AlN film is fabricated, the ScAlN film is formed by doping scandium. The doping concentration may be 5-50%, or even higher, depending on the requirements of the particular application.

The second structural material layer 20 may also be fabricated by molecular beam epitaxy (MBE) or plasma induced molecular beam epitaxy (PIMBE), using a conventional evaporation source for Al and a radio frequency plasma source to generate nitrogen radicals, thereby growing a high quality monocrystalline AlN film on the diamond surface. In order to further improve the concentration and mobility of two-dimensional electron gas, AlN can be doped to increase the piezoelectric coefficient of the material and to enhance the piezoelectric polarization effect. The fabricating method is that in the process of growing the AlN, besides the Al source, an Sc evaporation source is added to form a ScAlN material. It is also possible to use only one evaporation source, that is, the ScAl alloy fabricated according to a certain proportion is adopted to react with the nitrogen radicals generated by the radio frequency plasma source to form the ScAlN film, that is, the Sc-doped AlN film. The doping concentration may be 5-50% or even higher, which is determined by the proportion of the ScAl alloy material.

In step S1032, a portion of the second structural material layer 20 in the second region S2 is removed to form the second structural layer 2.

Specifically, as shown in FIG. 10 and FIG. 11, a lithography process may be performed on the surface of the second structural material layer 20 in the first region S1, and then the second structural material layer 20 in the second region S2 is etched, so as to form a second structural layer 2.

Figure 12:
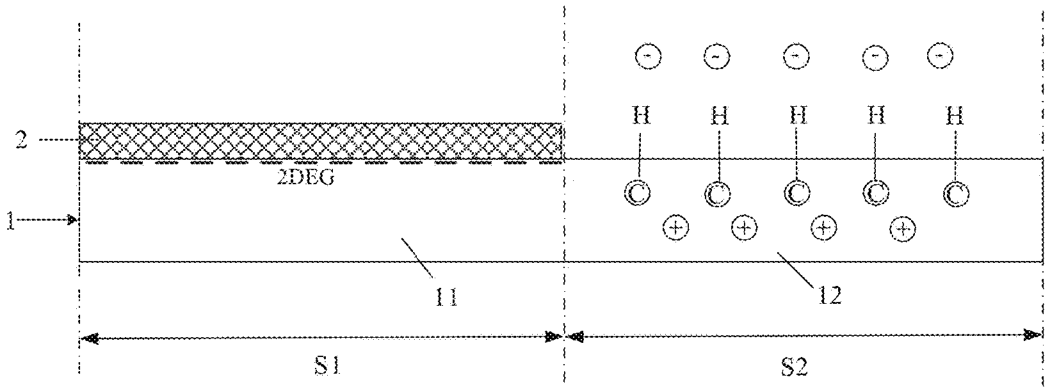

Referring to FIG. 12, in step S105, a hydrogen-termination treatment is performed on the first structural layer 1 in the second region S2.

Here, hydrogen termination technology is used to hydrogen terminate the first structural layer 1 (i.e., the diamond material) in the second region S2, so that a P-type channel can be formed on the surface of the material. The technology exploits the principles of electron exchange between materials and the doping of surface acceptors with high electron affinity (such as water molecules) to produce high two-dimensional hole concentration and mobility by hydrogen plasma treatment on the surface of diamond. Transistors fabricated by this mechanism are called hydrogen-terminated diamond field effect transistors (H-Terminated Diamond FETs). There are a variety of hydrogen-termination technologies, generally using microwave plasmas generated in hydrogen (H2) or deuterium (D2). In the process of hydrogen termination of diamond, the adjustable parameters are pressure, microwave power and time, for example, the pressure range is 50-300 Torr, the microwave power is 1-10 KW, and the time is 1-20 min. The fabrication steps may also be performed in steps, for example, first performed at low voltage and low power conditions, and then performed at high voltage and high power conditions. By optimizing the process parameters, the diamond surface with high two-dimensional hole concentration and high hole mobility can be obtained.

Figure 13:
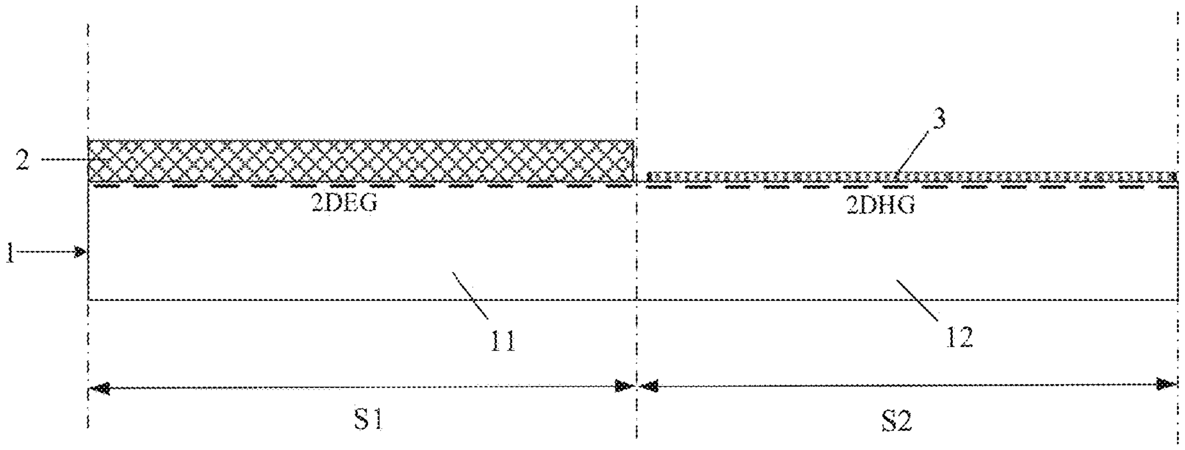

With reference to FIG. 13, for a semiconductor device having a gate dielectric layer 3, after step S105, the method further includes step S106:

a gate dielectric layer 3 is formed on the surface of the first structural layer 1 in the second region S2.

The material of the gate dielectric layer 3 may be one or more materials such as Al2O3, SiO2, MoO3, WO3, ZrO2, AlN, TiOx, HfO2, LaAlO3 and Ta2O5. The gate dielectric layer 3 may be formed by atomic layer deposition, metal organic chemical vapor deposition, or magnetron sputtering, etc.

In step S107, a portion of the first structural layer 1 located in the first region S1 is electrically isolated from a portion of the first structural layer 1 located in the second region S2.

Figure 14:
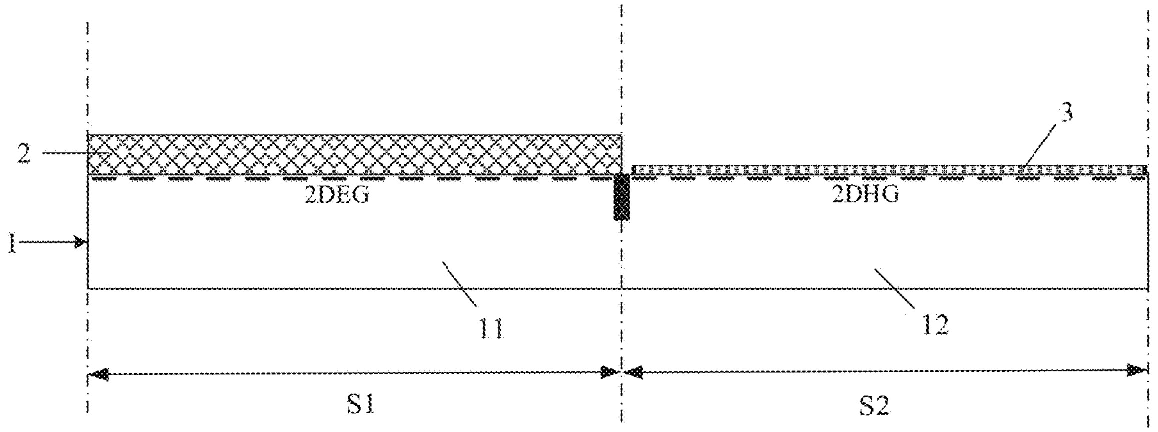

Referring to FIG. 14, specifically, in this step, an isolation strip 101 may be disposed on the portion of the first structural layer 1 not covered by the second structural layer 2. The isolation strip 101 is used to electrically isolate the first region S1 from the second region S2.

In some embodiments, the isolation strip 101 extends inward from the surface of the first structural layer 1 (i.e., the surface in contact with the second structural layer 2), and the isolation strip 101 extends a depth "h" of 2 nm-20 nm. The width "w" of the isolation strip 101 is 0.1 μm-5 μm.

The isolation strip 101 may be formed by adopting the technologies of etching, oxygen plasma treatment or ion implantation.

Figure 15:
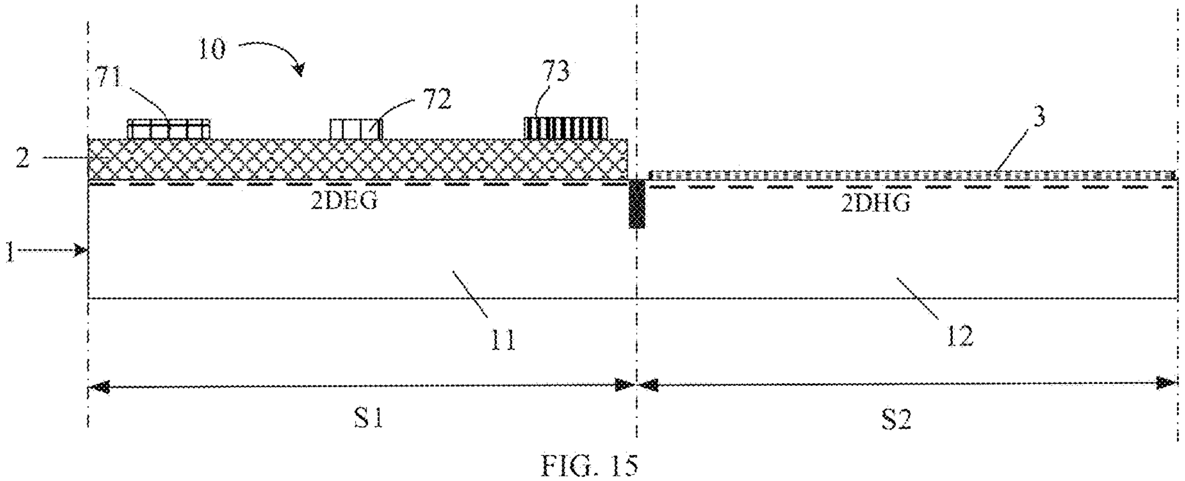
Figure 16:
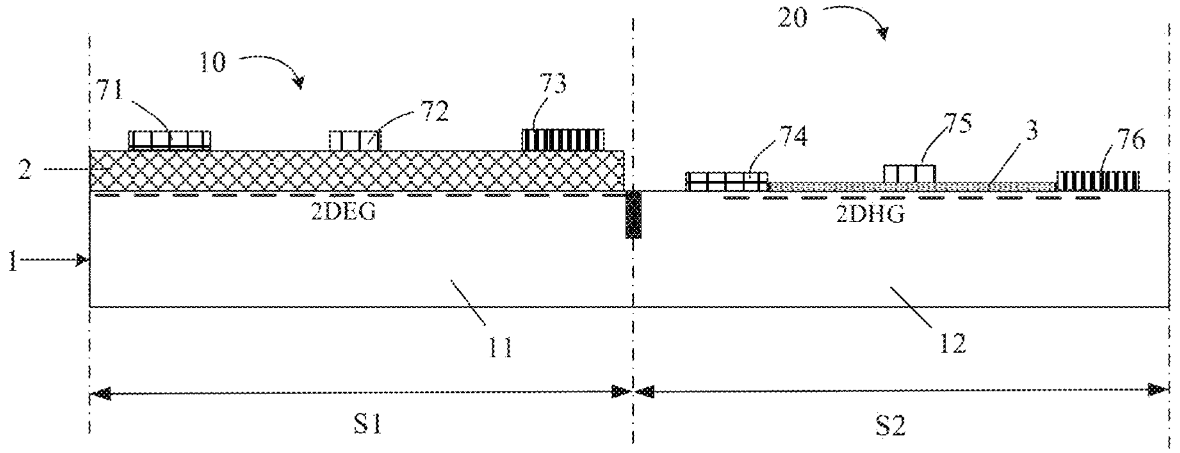

Referring to FIG. 15 and FIG. 16, in step S109, a first electrode structure and a second electrode structure are fabricated; wherein first electrode structure includes a first source electrode 71, a first gate electrode 72, and a first drain electrode 73. The first electrode structure is disposed in the first region S1 and at least partially on a side of the second structural layer 2 away from the first structural layer 1. The second electrode structure comprises a second source electrode 74, a second gate electrode 75, and a second drain electrode 76. The second electrode structure is disposed on the first structural layer 1 and in the second region S2, and is located on the same side of the first structural layer 1 as the first electrode structure.

In this embodiment, a first electrode structure is first formed, and then a second electrode structure is formed. In other embodiments, the order of forming the first electrode structure and the second electrode structure may also be reversed, or formed simultaneously.

The specific generation of the first electrode structure and the second electrode structure can be referred to the relevant descriptions of the above structural embodiments and will not be repeated herein.

Figure 17:
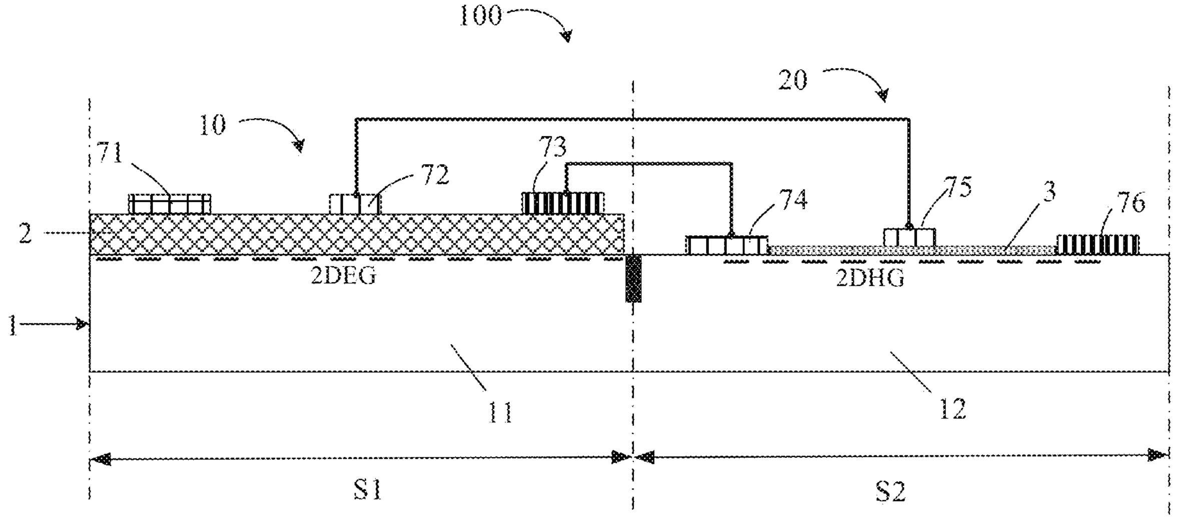

Referring to FIG. 17, after the first electrode structure and the second electrode structure are fabricated in step S109, the method further includes step S110:

The first drain electrode 73 is connected to the second source electrode 74, and the first gate electrode 72 is connected to the second gate electrode 75.

Metal wires may be used to connect the first drain electrode 73 to the second source electrode 74 and the first gate electrode 72 to the second gate electrode 75.

For a semiconductor device with a cap layer, such as shown in FIG. 2 and FIG. 3, accordingly, after the second structural layer 2 is formed in step S103, the method includes step S104 as follows.

In step S104, a cap layer 4 is formed on the surface of the second structural layer 2 away from the first structural layer 1.

The cap layer 4 may be, for example, gallium nitride or silicon nitride. The cap layer 4 may be AlGaN with a low Al composition, etc., such as AlGaN with an Al composition lower than 0.2. The thickness of the cap layer 4 ranges, for example, from 2 nm-20 nm.

The cap layer 4 may be fabricated in a variety of methods. For example, a common method for fabricating a GaN-based cap layer is metal organic chemical vapor deposition (MOCVD). Trimethylgallium (TMGa, C3H9Ga) and ammonia (NH3) are generally used as the gallium source and nitrogen source respectively, and hydrogen is used as the carrier gas. High-quality monocrystalline gallium nitride films may be grown by adjusting the pressure, temperature and gas flow of the reaction furnace.

It should be noted that, in this embodiment, the first structural layer 1 serves as a substrate.

With reference to FIG. 4, in some other embodiments, for a semiconductor device in which the first structural layer 1 is not used as a substrate, before the first structural layer 1 is formed, the method includes step S1001 as follows.

In step S1001, a substrate 5 is provided;

Forming the first structural layer 1 as described in step S101 includes:

forming a first structural layer 1 on top of the substrate 5.

The growth quality of the first structural layer 1 (e.g., diamond) may be optimized and the growth rate thereof may be improved by optimizing the fabrication process variables of the first structural layer 1, including pressure and concentration of reaction gas, substrate temperature, and sample stage, etc. The thickness of the first structural layer 1 fabricated is 0.1 μm-10 μm. Preferably, the MPCVD process may be used, and the process conditions are as follows: the power is 1 KW-10 KW, the pressure is 5 kPa-200 kPa, the gas ratio is 1-5% (N2/CH4), and the temperature is 1000° C.-1500° C.

In forming the first structural layer 1, the substrate 5 may preferably be mounted on a molybdenum substrate support to ensure a uniform temperature throughout the substrate, so that the thickness of different regions of the first structural layer 1 formed is relatively consistent.

For a semiconductor device with a substrate 5, after providing the substrate 5, the method optionally comprises:

polishing and cleaning the surface of the substrate 5.

Forming the first structural layer 1 on top of the substrate 5 comprises:

forming the first structural layer 1 on the polished and cleaned surface of the substrate 5.

Polishing methods herein include mechanical polishing, thermo-chemical polishing, electric spark polishing, laser polishing, ion beam polishing, plasma polishing, etc.

Here, cleaning may be ultrasonic cleaning with acetone or other solutions.

As the material of the substrate 5 and the material of the first structural layer 1 have different lattice constants and thermal expansion coefficients, the difference in lattice constants may cause lattice mismatch between the substrate 5 and the first structural layer 1, leading to dislocation defects. At the same time, the lattice mismatch will also cause the film layer to generate stress and cause the film layer warping and cracking, etc. The material of the substrate 5 and the material of the first structural layer 1 have different thermal expansion coefficients, which is easy to cause problems such as residual stress generated in the film during the fabricating process of the semiconductor device 30. Therefore, by disposing a buffer layer on the substrate, defects such as dislocation, warping, cracking and the like caused by different lattice constants and different thermal expansion coefficients of the substrate 5 and the first structural layer 1 can be eliminated or reduced, thereby contributing to improving the performance of the semiconductor device.

For a semiconductor device having the substrate 5, a buffer layer may also be disposed between the substrate 5 and the first structural layer 1.

Accordingly, after providing the substrate 5 and before forming the first structural layer 1, the method may further comprise:

forming a buffer layer over the substrate 5.

In the present application, the embodiments describing the structures and the embodiments describing the methods may be complementary to each other in the case of no conflict.

Those skilled in the art can understand that the embodiments described above in conjunction with the accompanying drawings are merely preferred embodiments, the implementation of the present application is not limited to these embodiments, and any modifications and equivalents that can be conceivable by a person skilled in the art should be encompassed within the scope of protection of the present application. Accordingly, the scope of protection of the present application is to be determined by the appended claims.

The invention claimed is:

1. A semiconductor device having a first region and a second region, comprising:

a first structural layer, wherein material of the first structural layer comprises monocrystalline diamond, and a portion of the first structural layer in the first region is electrically isolated from a portion of the first structural layer in the second region, and the portion of the first structural layer in the second region is subjected to hydrogen-termination treatment;

a second structural layer disposed on the first structural layer and located in the first region, wherein the second structural layer and the portion of the first structural layer in the first region form a heterojunction structure, and material of the second structural layer is a monocrystalline AlN film or a doped monocrystalline AlN film;

a first electrode structure, comprising a first source electrode, a first gate electrode, and a first drain electrode, the first electrode structure being disposed in the first region and at least partially on a side of the second structural layer away from the first structural layer;

a second electrode structure, comprising a second source electrode, a second gate electrode and a second drain electrode, wherein the second electrode structure is disposed on the first structural layer and located in the second region, and is on the same side of the first structural layer as the first electrode structure.

2. The semiconductor device according to claim 1, wherein the first drain electrode is connected to the second source electrode, and the first gate electrode is connected to the second gate electrode.

3. The semiconductor device according to claim 1, wherein the first structural layer serves as a substrate, or
the semiconductor device comprises a substrate, the substrate being on a surface of the first structural layer away from the second structural layer.

4. The semiconductor device according to claim 1, wherein the first structural layer has a thickness of 100 μm-500 μm if the first structural layer serves as a substrate, and has a thickness of 0.1 μm-10 μm if the semiconductor device comprises other layers in contact with the first structural layer as a substrate; and/or
the second structural layer has a thickness of 2 nm-30 nm.

5. The semiconductor device according to claim 1, wherein the first structural layer serves as a channel layer of the first region, the second structural layer serves as a barrier layer of the first region, and the semiconductor device comprises:
a cap layer disposed in the first region and on a surface of the second structural layer away from the first structural layer.

6. The semiconductor device according to claim 1, wherein
the semiconductor device is not provided with a cap layer,
wherein the first source electrode and the first drain electrode are both disposed on a surface of the second structural layer away from the first structural layer; or
a portion of the first source electrode is located on the surface of the second structural layer away from the first structural layer, another portion of the first source electrode penetrates through the second structural layer and is in contact with a surface of the first structural layer, and a portion of the first drain electrode is located on the surface of the second structural layer away from the first structural layer, and another portion of the first drain electrode penetrates through the second structural layer and is in contact with the surface of the first structural layer; or
the semiconductor device is provided with a cap layer,
wherein the first source electrode and the first drain electrode are both disposed on a surface of the cap layer away from the first structural layer; or
a portion of the first source electrode is located on the surface of the cap layer away from the first structural layer, another portion of the first source electrode penetrates through the cap layer and a partial depth of the second structural layer; and a portion of the first drain electrode is located on the surface of the cap layer away from the first structural layer, another portion of the first drain electrode penetrates through the cap layer and a partial depth of the second structural layer; or
a portion of the first source electrode is located on the surface of the cap layer away from the first structural layer, another portion of the first source electrode penetrates through the cap layer and the second structural layer and is in contact with the surface of the first structural layer; and a portion of the first drain electrode is located on the surface of the cap layer away from the first structural layer, another portion of the first drain electrode penetrates through the cap layer and the second structural layer.

7. The semiconductor device according claim 1, wherein the semiconductor device is not provided with a cap layer,
wherein the first gate electrode is disposed on a surface of the second structural layer away from the first structural layer; or
a portion of the first gate electrode is located on the surface of the second structural layer away from the first structural layer, another portion of the first gate electrode penetrates through a partial depth of the second structural layer;
the semiconductor device is provided with a cap layer,
wherein the first gate electrode penetrates through the cap layer and is in contact with the surface of the second structural layer, or
a portion of the first gate electrode is disposed on the surface of the cap layer away from the first structural layer, another portion of the first gate electrode penetrates through the cap layer and a partial depth of the second structural layer.

8. The semiconductor device according to claim 7, wherein if the first gate electrode penetrates through a partial depth of the second structural layer, a distance between a bottom end of the first gate and a bottom surface of the second structural layer is 2 nm-15 nm.

9. The semiconductor device according to claim 1, wherein a portion of the first structural layer not covered by the second structural layer is provided with an isolation strip for electrically isolating the first region from the second region.

10. The semiconductor device according to claim 9, wherein the isolation strip extends into the first structural layer from a surface of the first structural layer in contact with the second structural layer, an extension depth of the isolation strip is 2 nm to 20 nm, and a width of the isolation strip is 0.1 μm to 5 μm; and/or
the isolation strip is formed by adopting technologies of etching, oxygen plasma treatment or ion implantation.

11. The semiconductor device according to claim 1, wherein a two-dimensional electron gas is formed at an interface between the first structural layer and the second structural layer in the first region, and a N-type transistor is formed in the first region based on the two-dimensional electron gas; a two-dimensional hole gas is formed at a surface of the first structural layer in the second region, and a P-type transistor is formed in the second region based on the two-dimensional hole gas;
the semiconductor device is a CMOS device or an integrated circuit integrating the N-type transistor formed based on the two-dimensional electron gas in the first region and the P-type transistor formed based on the two-dimensional hole gas in the second region.

12. A semiconductor wafer, comprising a plurality of chips disposed in arrays, wherein each chip integrates a plurality of semiconductor devices according to claim 1.

13. A method of fabricating a semiconductor device, comprising:
forming a first structural layer, wherein material of the first structural layer comprises monocrystalline diamond;
forming a second structural layer, wherein the second structural layer is disposed on the first structural layer and located in a first region, and forms a heterojunction structure with a portion of the first structural layer located in the first region, and material of the second structural layer is a monocrystalline AlN film or a doped AlN film;

performing hydrogen-termination treatment on a portion of the first structural layer located in the second region;

electrically isolating the portion of the first structural layer located in the first region from the portion of the first structural layer located in the second region;

fabricating a first electrode structure and a second electrode structure, wherein the first electrode structure comprises a first source electrode, a first gate electrode and a first drain electrode, and is disposed in the first region and at least partially on a side of the second structural layer away from the first structural layer; the second electrode structure comprises a second source electrode, a second gate electrode and a second drain electrode, and the second electrode structure is disposed on top the first structural layer and located in the second region, and is on the same side of the first structural layer as the first electrode structure.

14. The method of fabricating a semiconductor device according to claim 13, wherein after fabricating the first electrode structure and the second electrode structure, the method comprises:

connecting the first drain electrode to the second source electrode, and connecting the first gate electrode to the second gate electrode.

15. The method of fabricating a semiconductor device according to claim 13, wherein prior to forming the first structural layer, the method comprises: providing a substrate;

the forming the first structural layer comprises:

forming the first structural layer on the substrate.

16. The method of fabricating a semiconductor device according to claim 15, wherein after providing the substrate, the method comprises:

polishing and cleaning a surface of the substrate;

the forming the first structural layer on the substrate comprises:

forming the first structural layer on the polished and cleaned surface of the substrate.

17. The method of fabricating a semiconductor device according to claim 13, wherein after forming the second structural layer, the method comprises:

forming a cap layer on a surface of the second structural layer away from the first structural layer.

18. The method of fabricating a semiconductor device according to claim 13, wherein electrically isolating the portion of the first structural layer located in the first region from the portion of the first structural layer located in the second region comprises:

providing an isolation strip at a portion of the first structural layer not covered by the second structural layer, wherein the isolation strip is used for electrically isolating the first region from the second region.

19. The method of fabricating a semiconductor device according to claim 18, wherein the isolation strip extends inward from a surface of the first structural layer in contact with the second structural layer, an extension depth of the isolation strip is 2 nm to 20 nm, and a width of the isolation strip is 0.1 μm to 5 μm; and/or the isolation strip is formed by adopting technologies of etching, oxygen plasma treatment or ion implantation.

20. The method of fabricating a semiconductor device according to claim 13, wherein the forming the second structural layer comprises:

forming a second structural material layer on the first structural layer;

removing a portion of the second structural material layer which is located in the second region to form the second structural layer.

* * * * *